United States Patent [19]

Jett, Jr.

[11] Patent Number: 4,459,555
[45] Date of Patent: Jul. 10, 1984

[54] MOS DIFFERENTIAL AMPLIFIER GAIN CONTROL CIRCUIT

[75] Inventor: William B. Jett, Jr., San Jose, Calif.

[73] Assignee: National Semiconductor Corporation, Santa Clara, Calif.

[21] Appl. No.: 460,325

[22] Filed: Jan. 24, 1982

[51] Int. Cl.³ .......................... H03F 3/45; H03G 3/30
[52] U.S. Cl. .................................... 330/253; 330/254; 330/257; 330/284; 330/288
[58] Field of Search ............... 330/253, 254, 257, 278, 330/284, 288; 323/315, 316

[56] References Cited

U.S. PATENT DOCUMENTS 3,710,270  1/1973  Addis et al. .................... 330/284 X
4,371,843  2/1983  Fang et al. ........................... 330/253

Primary Examiner—James B. Mullins
Attorney, Agent, or Firm—Gail W. Woodward; Paul J. Winters; Michael J. Pollock

[57] ABSTRACT

A modulator circuit is disclosed in which a pair of differentially modulated direct currents are mirrored to an output. A control potential acts to vary the modulation without changing the direct current values. A CMOS version of a complete variable gain amplifier is detailed in which the common mode output is $V_{CC}/2$ and is not changed with variations in the gain control potential or the input common mode potential.

13 Claims, 2 Drawing Figures

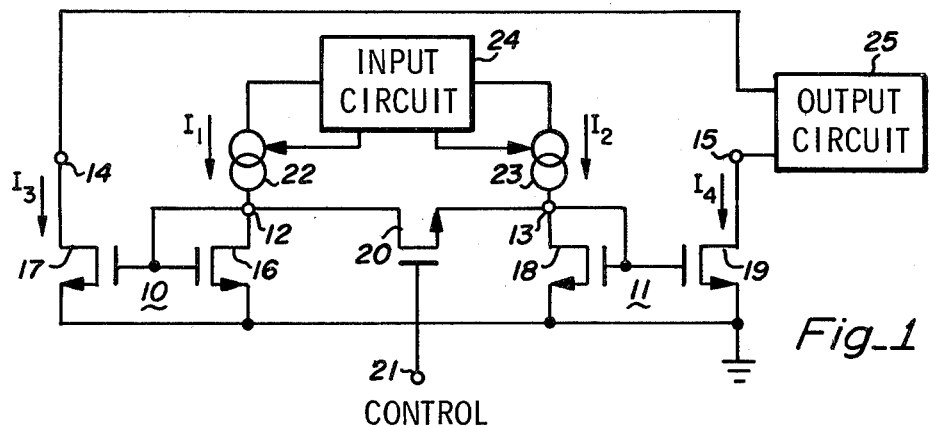
Fig_1
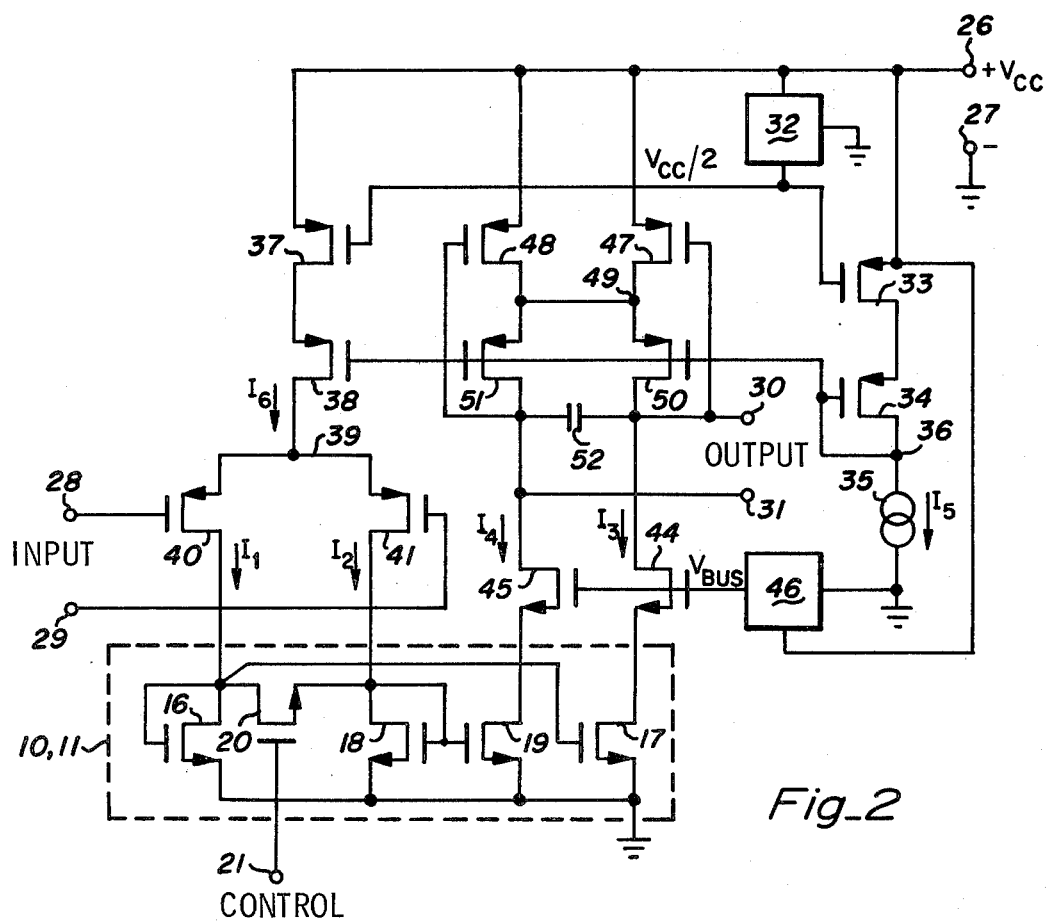
Fig_2

MOS DIFFERENTIAL AMPLIFIER GAIN CONTROL CIRCUIT

BACKGROUND OF THE INVENTION

Metal oxide semiconductor (MOS) devices are being extensively incorporated into linear integrated circuit (IC) devices. While such devices have been common in digital structures, their performance is such that bipolar transistors have dominated in linear applications. However, where it is desired to combine linear and digital functions on the same IC chip it would be extremely useful to fabricate the linear circuits in MOS form. In particular the use of complementary metal oxide semiconductors (CMOS) structures would be desirable. One of the linear circuit functions that has been difficult to implement in MOS is voltage-controlled variable gain amplifiers.

SUMMARY OF THE INVENTION

It is an object of the invention to provide an MOS circuit in which the signal level can be varied in response to a control voltage without changing the d-c circuit levels.

It is a further object of the invention to gain control the signal level in a linear differential MOS amplifier in response to a control voltage without varying the d-c conditions.

These and other objects are achieved as follows. A pair of current mirrors is supplied with input currents that include a d-c component and a differential signal component. A control transistor is connected between the current mirror inputs which comprise matched MOS transistors. The gate of the control transistor is connected to a source of d-c control potential. When the control transistor is biased below cutoff, the mirrors will operate normally and the mirror outputs will include the differentially related signal components. When the control transistor is biased full on the mirror, inputs will be essentially paralleled so that the mirrors operate as a single unit. In this case the differentially related signals will cancel and the mirror outputs will contain only the d-component. As a practical matter this latter condition cannot be completely realized and total signal cancellation is impractical. However, a substantial signal reduction can be achieved when the control transistor is made conductive. The degree of cancellation, or signal reduction, is a function of the conductivity of the control transistor and hence the applied control voltage.

BRIEF DESCRIPTION OF THE DRAWING

FIG. 1 is a schematic diagram of the basic circuit of the invention.

FIG. 2 is a schematic diagram of a complete gain controlled differential amplifier.

DESCRIPTION OF THE INVENTION

FIG. 1 shows a pair of current mirrors 10 and 11 having input terminals 12 and 13. Terminals 14 and 15 make up the mirror output terminals. Mirror 10 is made up of input transistor 16 and output transistor 17 while mirror 11 is made up of input transistor 18 and output transistor 19. Control transistor 20 is connected between the mirror input transistors 16 and 18. While all of the transistors are shown as N channel devices and the terminals 12–15 all sink their respective currents, the devices could be of P channel construction and terminals 12–15 could then act as current sources.

Typically transistors 16–19 are matched so that the mirrors each have unity current gain. However, if desired, transistors 17 and 19 could be scaled with respect to transistors 16 and 18 so that mirror gain (or loss) could be achieved. In this event the mirrors should desirably have matched input devices.

Current sources 22 and 23 are shown as being driven and controlled from input circuit 24 and respectively apply $I_1$ to mirror 10 and $I_2$ to mirror 11. $I_1$ will include a d-c component and a signal component so that $I_1 = I_{DC} + I_{SIG}$. The drive is arranged so that source 23 supplies a differential signal to mirror 11 so that $I_2 = I_{DC} - I_{SIG}$. If transistor 20 is biased on so that it acts as a short circuit between transistors 16 and 18, the input currents are summed so that $I_{INPUT} = I_{DC} + I_{SIG} + I_{DC} - I_{SIG} = 2I_{DC}$. In other words, the differential signal components cancel. Since transistors 16 and 18 are matched, $I_{DC}$ will flow in each one. The current mirror outputs $I_3$ and $I_4$ will therefore be equal to $I_{DC}$ and no signal will be present.

When transistor 20 is biased off, the mirrors will operate normally and drive a utilization or output circuit 25 so that $I_3 = I_{DC} + I_{SIG}$ and $I_4 = I_{DC} - I_{SIG}$. Actually the output currents will be $I_3 = I_{DC} + kI_{SIG}$ and $I_4 = I_{DC} - kI_{SIG}$ where k is a factor determined by the conduction in transistor 20 in accordance with the relationship:

$$k = \frac{\frac{R_{20}}{2}}{\frac{1}{G_m} + \frac{R_{20}}{2}}$$

where:
$R_{20}$ is the resistance of transistor 20 and $G_m$ is the transconductance of either of transistors 16 or 18 which are matched and therefore equal.

It can be seen that as the voltage level on terminal 21 is varied the signal level will be varied at the current mirror outputs. As long as transistors 16 and 18 are matched, there will be no shift in the D-C levels with changes in signal level.

FIG. 2 is a schematic diagram of a CMOS differential amplifier implementation of the circuit of the invention. Where the parts are identical to those of FIG. 1, the same numbers are used. The circuit is operated from a $V_{CC}$ power supply connected + to terminal 26 and − to ground terminal 27. Terminals 28 and 29 are the differential signal inputs and terminals 30 and 31 represent the differential signal output. The circuit is arranged so that output terminals 30 and 31 are operated at a d-c voltage level that is $V_{CC}/2$ and does not change as the input common mode voltage varies or as the control voltage on terminal 21 varies.

Block 32 is a conventional device that provides a voltage level of $V_{CC}/2$ for the gates of transistors 33 and 37. Current sink 35 passes $I_5$ which sets the circuit operating current. It also flows in the series combination of transistors 33 and 34. Since the gate of transistor 33 is at a level of ½ of its source voltage, it will be turned on so that the drain of transistor 33 will be only a fraction of a volt below $V_{CC}$. The circuit arrangement is such that node 36 will typically be about 1.5 volts below $V_{CC}$.

Transistors 37 and 38 pass I$_6$ which is a mirrored value of I$_5$. It is the tail current of differential input pair 40 and 41. Because the gates of transistors 37 and 38 are respectively connected to the gates of transistors 33 and 34, I$_6$ mirrors I$_5$. This means that the potential at node 39 will track the common mode potential at input terminals 27 and 28 but the common mode potential will not vary I$_6$. The input stage causes I$_6$ to equal the sum of I$_1$ and I$_2$ which comprise the differentially modulated inputs to the current mirrors 10 and 11 of FIG. 1 which are shown inside the dashed outline. Their operation is as explained above.

I$_3$ and I$_4$, the current mirror outputs, flow respectively in transistors 44 and 45 which are cascode connected between the current mirror outputs and output terminals 29 and 30. The gates of transistors 44 and 45 are supplied with a constant bias potential by conventional means illustrated as block 46. The only requirement of this potential is that it exceeds 2 V$_{TN}$ so that transistors 17, 19, 44, and 45 are operated in their saturated region. This ensures that the circuit impedance between terminals 30 and 31 is very high.

Transistors 47 and 48 respectively conduct I$_3$ and I$_4$ and their gates are returned respectively to output terminals 30 and 31. If transistors 47 and 48 are each made to have an area of ½ that of transistor 33, their combined area will match so that they will mirror I$_5$ and I$_3$+I$_4$ =I$_5$. Also the potential at node 49 will match the potential at the drain of transistor 33 which is shown above to be close to V$_{CC}$. Since the gate of transistor 33 is returned to V$_{CC}$/2 and since the combination of transistors 47 and 48 match transistor 33, node 49 will assume a potential equal to the drain of transistor 33 and the output terminals will operate at a voltage of V$_{CC}$/2.

Transistors 50 and 51, which are made to match in combination transistor 34, act to conduct I$_3$ and I$_4$ respectively as cascode coupling devices to output terminals 29 and 30. This ensures the above mentioned high impedance output condition.

Capacitor 52 is the amplifier frequency compensation capacitor. It produces a roll off in gain of 6 db per octave at the higher frequencies. Since the circuit output impedance is high, the value of capacitor 52 can be kept relatively small and still perform its desired function.

EXAMPLE

The circuit of FIG. 2 was constructed using conventional CMOS devices. The following transistor sizes were employed.

| DEVICE | W/L (MICRONS) |
|---|---|
| 16–19 | 80/10 |
| 20 | 160/10 |
| 33,37 | 40/5 |
| 34,38 | 240/10 |
| 40,41 | 70/10 |
| 44,45 | 100/5 |
| 47,48 | 20/5 |
| 50,51 | 120/10 |

Capacitor 52 was 1.45 pf and I$_5$ was set at about 60 microamperes. The knee of the frequency versus gain curve was at about 150 kHz. The gain was about 20 db at 262 kHz. Using a 260 kHz carrier amplitude modulated at 80%, the recovered modulation showed less than 1% distortion over a 29 db control range.

The invention has been described and a preferred embodiment detailed. When a person skilled in the art reads the foregoing description, alternatives and equivalents, within the spirit and intent of the invention, will become apparent. For example, while the preferred embodiment is shown in CMOS, either PMOS or NMOS could be employed to implement the invention. Accordingly, it is intended that the scope of the invention be limited only by the following claims.

I claim:

1. An MOS gain control circuit comprising:
    first and second current mirrors, each one having an input and an output;
    means for applying input currents to said inputs of said first and second current mirrors, said input currents including a direct current component and a signal component with said signal component appearing as differential variations in the direct current components of said input currents; and
    a control transistor having a pair of controlled terminals coupled between said inputs of said first and second current mirrors and a control terminal responsive to a voltage input whereby said signal components in said outputs of said first and second current mirrors can be varied as a function of said voltage input.

2. The circuit of claim 1 wherein each of said current mirrors comprise:
    an input transistor having its gate returned to its drain and a source electrode;
    an output transistor having its gate coupled to said drain of said input transistor, its source coupled to said source of said input transistor and a drain which provides said current mirror output; and
    means for coupling said sources to a supply terminal which provides a source of current carriers.

3. The circuit of claim 2 wherein said means for applying input currents comprise:
    first and second signal responsive transistors, each one having source, drain, and gate electrodes;
    means coupling said sources of said first and second transistors in common to a constant source of current carriers;
    means coupling said drains of said first and second transistors respectively to said inputs of said first and second current mirrors; and
    means for coupling a source of signal to said gates of said first and second transistors whereby said first and second transistors are differentially driven by said signal.

4. The circuit of claim 3 wherein said drains of said output transistors of said first and second current mirrors are coupled to a pair of circuit output terminals by way of a pair of interposed cascode connected transistors.

5. The circuit of claim 4 wherein said pair of output terminals are returned to a third current mirror having an input that is operated at a desired voltage level whereby said output terminals are operated substantially at said desired voltage.

6. A CMOS gain control circuit comprising:
    first and second supply rails connectable to a source of operating power;
    a first NMOS transistor having a source coupled to said first rail, and a gate and drain coupled together to a first current input terminal;
    a second NMOS transistor having a source coupled to said first rail, a gate coupled to said drain of said first transistor and a drain coupled to a first current output terminal;

a third NMOS transistor having a source coupled to said first rail, and a gate and drain coupled together to a second current input terminal;

a fourth NMOS transistor having a source coupled to said first rail, a gate coupled to said drain of said third transistor, and a drain coupled to a second current output terminal;

a fifth NMOS transistor having its source-drain circuit coupled between said drains of said first and third transistors and a gate coupled to a control terminal; and means for providing inputs to said first and second input terminals whereby each of said input currents includes a d-c component and a signal component.

7. The circuit of claim 6 further comprising:

sixth and seventh PMOS transistors having their sources coupled together, their gates coupled to differential signal input terminals, and their collectors respectively coupled to the collectors of said first and third transistors to provide the current inputs therefor; and an eighth PMOS transistor having its drain coupled to the sources of said sixth and seventh transistors, a gate coupled to a source of constant potential, and a source coupled to said second rail whereby said differential signal input differentially modulates the current inputs to said first and third transistors.

8. The circuit of claim 7 further comprising:

ninth and tenth NMOS transistors having their gates commonly coupled to a source of constant bias potential, their sources respectively coupled to said drains of said second and fourth transistors, and their drains coupled respectively to first and second signal voltage output terminals thereby to provide a cascode output.

9. The circuit of claim 8 further comprising:

an eleventh PMOS transistor having its source coupled to said second rail, its gate coupled to a source of potential that is midway between the potentials applied between said first and second rails, and a drain; and a twelfth PMOS transistor having its source coupled to said drain of said eleventh transistor, its gate and drain coupled together to said gate of said eighth transistor and through a constant current sink to said first terminal whereby a current mirror input section is created with a current flowing therein when said circuit is energized.

10. The circuit of claim 9 further comprising:

thirteenth and fourteenth PMOS transistors having their sources coupled to said second rail, their drains coupled together, and their gates coupled respectively to said first and second signal voltage output terminals; and fifteenth and sixteenth PMOS transistors having their sources coupled to said drains of said thirteenth and fourteenth transistors, their drains coupled respectively to said first and second signal voltage output terminals, and their gates coupled in common to the drain of said twelfth transistor thereby preserving said cascode output and said signal voltage output terminals have a common mode potential equal to said potential that is midway between said first and second rails.

11. The circuit of claim 10 further comprising:

a seventeenth PMOS transistor having its source drain circuit coupled in series between said second rail and said source of said eighth transistor and its gate coupled to the gate of said eleventh transistor wherein the current flowing in said eighth and said seventeenth transistors is slaved to said current in said current mirror input section.

12. The circuit of claim 11 wherein said seventeenth transistor is matched to said eleventh transistor and is matched to said thirteenth and fourteenth transistors in combination and said eighth transistor is matched to said twelfth transistor and to said fifteenth and sixteenth transistors in combination.

13. The circuit of claim 12 in further combination with a frequency compensation capacitor coupled between said first and second signal voltage output terminals.

* * * * *